METHOD OF FORMING A LAMINAR SUPERCONDUCTOR

Filed June 13, 1961

John L. Miles
Paul H. Smith
*INVENTORS*

BY [signature]
Attorney 3,251,715
Patented May 17, 1966

3,251,715

METHOD OF FORMING A LAMINAR SUPERCONDUCTOR

John L. Miles, Belmont, and Paul H. Smith, Cambridge, Mass., assignors to Arthur D. Little, Inc., Cambridge, Mass., a corporation of Massachusetts Filed June 13, 1961, Ser. No. 116,844
1 Claim. (Cl. 117—212)

This invention relates to superconductors and more particularly to novel types of superconductors and apparatus containing them.

The properties associated with superconducting metals (e.g., the ability to exhibit zero resistance at and below specified low temperatures and the ability to be reconverted to the resistive state by the application of a magnetic field) have made superconducting materials particularly attractive in the construction of new types of circuit elements. For example, the now well-known cryotron depends upon the control of superconducting components for its operation; and a recently developed tunneling device which requires the use of one or more components which exhibit a conduction electron energy gap may be constructed of superconducting materials.

Superconductors may generally be defined as metals which, when subjected to temperatures approaching absolute zero, are capable of undergoing a change of state of the following nature: in the absence of a magnetic field at a specified temperature these superconductors change suddenly from a resistive state to a superconducting state in which their resistance is zero. The temperature at which this change occurs is known as the transition temperature or critical temperature ($T_c$) and this temperature is a substantially invariant characteristic of the superconducting metal. For example, the transition temperature of aluminum is 1.2° K., of indium 3.4° K., niobium 8.7° K., tin 3.7° K., lead 7.2° K., tantalum 4.4° K., and vanadium 4.9° K. In addition, some 16 other metals are known to be superconducting; and there are also a number of metallic compounds and alloys such as MoC, NbN, $Nb_3Sn$ which are known to be superconducting.

When a magnetic field is applied to the superconductor, the transition temperature is lowered and a point is reached at which the metal is no longer superconducting even at 0° K. The intensity of the magnetic field required to convert a superconductor to its resistive state at 0° K. is known as the critical field ($H_o$). Thus there is for each superconducting metal, metallic compound or alloy an area or region of superconductivity which is characteristic of the superconductor and which is essentially invariant for any one material. The area under the curve in FIG. 1 illustrates the superconducting region for a typical metal. Taking lead as an example, $T_c$ as noted above is 7.2° K., while $H_o$ is 800 oersteds.

According to a recently developed theory of superconductivity (Phys. Rev. 108, 1175 (1957)), a gap exists in the conduction electron energy spectrum of superconductors. The magnitude of this gap depends both upon the temperature of the superconducting material and upon the intensity of the magnetic field, as well as upon the choice of material. Thus the presence of an electron energy gap is a characteristic of all superconductors when in the superconducting state and the width of the gap is a specific characteristic of each material.

In the following description of this invention, the term "superconductor" will be used to designate materials having the properties described above, while the term "non-superconductors" will be used to refer to any metal which does not exhibit superconductivity, i.e., one which remains normally conductive or resistive throughout all temperatures. Thus the term "superconductor" as used hereinafter includes those metals, metallic compounds and alloys which are naturally superconducting under specified temperature and magnetic field conditions as well as synthetic superconductors made in accordance with this invention. In order to distinguish these two types of superconductors, where such distinctions are necessary, they will be referred to as "natural superconductors" and "laminar superconductors."

It will be seen from the brief presentation of superconductivity that each metal which is naturally superconductive has a well defined and essentially invariable range of superconductivity and that this is unalterable for any given superconductor. In the construction of cryotrons, tunneling devices and other circuit elements which require or preferably incorporate superconducting components, it would be highly desirable to be able to adjust or predetermine the $T_c$ and/or $H_o$ without having to work within the limits of the properties of the natural superconductors themselves.

It would be highly desirable, in addition, to be able to adjust the $T_c$ or $H_o$ of a superconductor to be able to impart to non-superconductors an electron energy gap and further to be able to control the width of this electron energy gap.

Moreover, from a practical point of view in the construction of electronic devices which are generally formed by depositing thin films of metals from a vapor phase (such as by vacuum deposition techniques) it is highly desirable to be able to control the construction of these elements. For example, in the construction of a cryotron, it may be desirable to form a film of a superconductor such as lead and to remove the cryotron from its evacuated atmosphere for construction work prior to the deposition of an insulating layer and a second superconductor. However, this is normally not possible since superconductors such as lead will readily form a molecular layer of lead oxide when exposed to the atmosphere. This, of course, prevents subsequent successful construction of the cryotron. This difficulty may be overcome by depositing on the first superconductor film a thin film of a non-superconductor metal, which is not readily oxidized, prior to exposing the superconductor film to the atmosphere. This non-oxidized metal layer will protect the first superconductor and as will be shown below, the combination of films will still retain the properties of a superconductor.

It is therefore an object of this invention to provide new superconductors, the critical temperatures, $T_c$, and the critical magnetic fields, $H_o$, of which may be adjusted and predetermined. It is another object of this invention to provide means for changing the $T_c$ and $H_o$ of a superconductor.

It is another object of this invention to provide a method for establishing an electron energy gap in a metal which normally does not exhibit such an electron energy gap, and to furnish a method for adjusting the width of an electron energy gap existing in a metal or metal combination. Yet another object is to provide new and novel electrical circuit elements which operate at cryogenic temperatures. Still another object is to provide a process for preparing cryogenic electrical circuit elements. These and other objects will become apparent in the following description.

We have found that novel laminar superconductors, which exhibit electron energy gaps at cryogenic temperatures, can be constructed by super-imposing a body or element (generally a film) of a natural superconductor on a body or element (generally a film) of a metal which when isolated is a non-superconductor at the temperature at which the laminar superconductor is superconducting.

The $T_c$ and $H_0$ of the resulting novel laminar superconductor depend upon and are fixed by the relative and absolute thicknesses of the individual elements hereinafter called "films." Both the $T_c$ and $H_0$ of the laminar superconductor will differ from those of the natural superconductor and the difference can be controlled by varying the film thicknesses and the method of construction. The films are preferably formed by condensation from the vapor phase, conveniently by building one film on the other by vacuum deposition techniques. Of course, other methods of depositing metal films are applicable to the process of this invention, and these include, but are not limited to, electrolytic deposition. It is also within the scope of this invention to employ films deposited on bulk materials.

The method and resulting products of this invention may now be more fully described with reference to the accompanying drawings in which FIG. 1 is a plot showing the relationship of temperature to magnetic field for a typical superconductor to illustrate the region of superconductivity associated with it;

Figure 1:
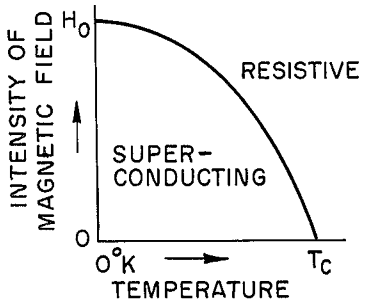

The region of superconductivity represented by the area under the curve of FIG. 1 has been discussed above with respect to the definition of superconductivity. It will now be shown how this region may be changed for any given superconductor and how the resulting new superconductor, to be referred to as a laminar superconductor, may be used in several types of circuit elements.

Figure 2:
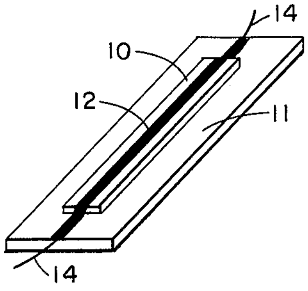
FIG. 2 and 3 are perspective and cross-sectional views, respectively, of a laminar superconductor made in accordance with this invention.
Figure 3:
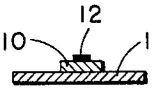

Turning now to FIGS. 2 and 3, these drawings illustrate the simplest form of a superconductor constructed in accordance with the teaching of this invention. It will be appreciated that in the drawings of the various superconductors and elements no attempt has been made to illustrate relative thicknesses. The drawings are to be considered schematic. The superconductors of FIGS. 2 and 3 were typically constructed by superimposing along the length of a glass substrate 11 (microscope slide) a length of silver film about 1 cm. long and 0.3 mm. wide as the non-superconductor 10 and over this a longer lead film approximately 0.15 mm. wide as the natural superconductor 12. The films were deposited by vacuum deposition techniques at pressures lower than $2\times10^{-5}$ Hg. It will, of course, be appreciated that the widths and lengths of films used in the construction described are only examples and that neither is critical as long as a pure silver surface is brought into contact with a pure lead surface. It would also of course be possible to deposit the natural superconductor (lead) first and then form the metal film of the non-superconductor (silver) over it. The order in which the films are formed is not critical.

For evaluating the superconductor of FIGS. 2 and 3, suitable connecting wires 14 were soldered to the lead strip 12. In the course of this construction there was no appreciable delay in the deposition of the films and there was no exposure to the atmosphere between successive depositions. This is a preferred method of construction. However, as pointed out above, if either metal is one which is not readily oxidized it may be exposed to the atmosphere between depositions. Of course, care must be taken to prevent any other contamination of the pure metal surface in handling. For example, a silver surface should not be exposed to an atmosphere containing sulfide or chloride ions.

A number of laminar superconductors such as illustrated in FIG. 2 were deposited simultaneously on the same substrate to build films of lead on films of silver having varying thicknesses. The electrical resistances of the assemblies thus constructed were measured by passing a low frequency current through each of the specimens, measuring the voltage across the specimen, and displaying its voltage current characteristics on an oscilloscope. Critical temperatures were determined to within a few millidegrees by the first appearance of zero slope, corresponding to zero resistance, at the origin of the trace. Isothermal critical fields were determined similarly by applying an external magnetic field, tangential to the films and normal to the direction of current flow. Critical currents were obtained by noting the value of the instantaneous current at which the characteristic deviated from zero slope. Near the critical temperature critical currents as small as 25 microamperes were measured.

Figure 6:
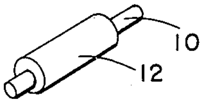
FIG. 6 is a perspective view of yet another modification of the laminar superconductor of this invention.

FIG. 6 illustrates how one of the metals may be of a configuration other than a film. The other metal is then formed in contact with it. Although FIG. 6 shows a non-superconductor 10 encircled by a natural superconductor 12, the arrangement may be reversed.

Figure 7:
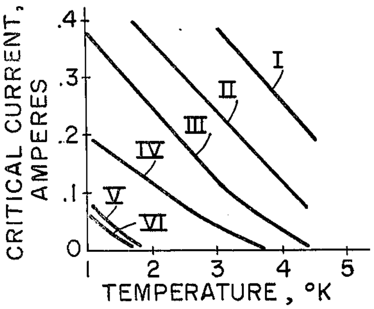
FIG. 7 is a plot of temperature versus critical current for the superconductors of FIGS. 2 and 4.

FIG. 7 shows the variation with temperature of the critical currents of the laminar superconductors constructed as described above. In FIG. 6 curves I–IV represent superconductors constructed as in FIG. 2 in which the thickness of the silver films were about 110, 362, 886 and 1840 A. thick, respectively. The thickness of the lead film was maintained essentially constant varying from about 485 to 600 A.

Typically in a construction such as that illustrated in FIGS. 2 and 3 the superconducting and normal metal film thicknesses can be varied between about 100 and 10,000 A. In using a combination of pure lead and silver as in FIG. 2, it has been found possible to produce a laminar superconductor having a $T_c$ as low as 3.5° K., whereas the $T_c$ of pure lead is 7.2° K. The difference between the two transition temperatures depends upon the thicknesses of the lead and silver as shown in FIG. 7.

Figure 4:
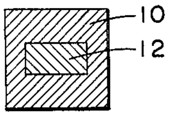
FIGS. 4 and 5 are cross-sectional views of modifications of the laminar superconductor of this invention.
Figure 5:
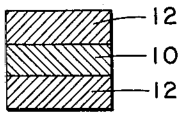

It is also of course possible to form other combinations of natural superconductors and non-superconductors and two such combinations are illustrated in FIGS. 4 and 5. In FIG. 4 the natural superconductor 12 is surrounded by a non-superconductor 10 thus forming a type of structure in which the natural superconductor is the middle layer. The performance of a superconducting combination such as in FIG. 4 is illustrated in curves V and VI of FIG. 7. As expected in an arrangement such as in FIG. 4 there is a greater difference between the $T_c$ of the natural superconductor and that of the laminar superconductor than in the arrangement of FIG. 2. Typically for a lead film having a thickness of about 500 A. and a 3,000 A.-thick film of silver, the $T_c$ of the laminar superconductor is depressed to 1.8° K. from that of 7.2° K. for pure lead. Generally in a superconductor of the type of FIG. 4, the superconductor may range in thickness from about 100 to 10,000 A. while the film of the non-superconductor may range in thickness from about 100 to 20,000 A.

In a like manner, where a non-superconductor is placed between two superconductors such as shown in FIG. 5, the $T_c$ of the combination differs from that of the natural superconductor but not as much as in the case of the arrangement in FIG. 2. Film thicknesses of the same order of magnitude, e.g., up to about 20,000 A. may be used for this modification.

In FIG. 7 it will be seen that all of the curves, which represent variation with temperature of the critical currents of the sample superconductors, show the progressive change of the transition temperature with increasing thickness of the non-superconductor (silver in this case) for virtually constant thicknesses of lead. A progressive reduction in the critical currents at a given temperature also occurs with increasing thickness of the non-superconductor film, but variation in total thicknesses complicates such comparisons.

All of the curves of FIG. 7 show a linear relationship between $I_c$ and T except for the gradual approach to the T axis at small values of $I_c$. The later may be indicative of intermediate state effects.

The observations on which the curves of FIG. 7 are based were found to be highly reproducible. One set of data was obtained after cooling the specimens to 80° K. within 10 minutes of film deposition, while a second set was obtained one week later after the superconductors were stored at room temperature. No obvious change occurred in the properties of the specimen for all of the data fell on the curves indicated.

In like manner the critical fields ($H_o$) are depressed and thus the critical fields may also be regulated and predetermined by adjusting the thicknesses of the films of the natural superconductors and the non-superconductors.

The systematic change of the transition temperature with increasing thickness of silver film on a constant thickness of lead film, the reproducibility and the very low transition temperatures (e.g., the transition temperatures of samples V and VI of FIG. 7 were approximately one-fourth that of pure lead) make it unlikely that the effects are secondary in nature and the result of impurities, strains, diffusion or alloying. All metals used to form the laminar superconductors were 99.999% pure. The nature of the effects was unchanged by the type of construction (represented in FIGS. 2 and 4) or by the sequence of deposition. The data did not change with the passage of time. Finally, the lead-silver phase diagram is well known and the superconducting properties of the alloy system have been studied. The solid solubility of silver in lead is extremely small (a maximum of 0.2 at. percent at 300° C.) and that of lead in silver is modest (a maximum of 2.8 at. percent at 600° C. dropping to 0.8 at. percent at 300° C.). Further, any solid alloy of lead and silver is a mixture of the two solid solutions. It has been shown that the transition temperature of lead is substantially unaltered by the addition of silver up to a silver concentration of about 80% whereupon the mixture ceases to be superconducting. This suggests that the superconductivity of the alloy is due to the presence of a continuous phase of lead containing some silver in solution; when this phase is not present in sufficient amount to form a continuous path through the specimen the alloy remains a non-superconductor. It follows, therefore, that the maximum amount of silver in lead has a negligible effect on the transition temperature of lead, whereas silver containing the maximum amount of lead remains a non-superconductor.

The data obtained on the superconductors of FIGS. 2 and 4 indicate that a metal film of a non-superconductor in immediate contact with a film of a superconductor will depress the transition temperature of the superconductor, the depression being greater for increasing thickness of the normal metal. To determine if the non-superconductor metal actually becomes superconducting two additional sets of experiments were performed.

In the first, silver films of various thicknesses were sandwiched between lead films in a persistent current loop, arranged so that the current flowed through the silver. Since tin was present elsewhere in the loop, persistent currents were observed only below 3.7° K., the $T_c$ of tin. In one loop containing about 2800 A. of silver between two lead films, each about 2000 A. thick, a persistent current of 2.9 amperes at 3.64° K. was observed. Although a change in current of a few percent would be easily detected, no change was observed in a period of one and one-half hours. From prior experience in the use of the persistent current loop and the associated measuring techniques, the inductance of the loop is known to be less than $10^{-10}$ henries. Accordingly, the upper limit to the loop resistance can be set at $10^{-15}$ ohms, whereas the computed resistance of the silver (using known area, thickness and bulk resistivity) is greater than $10^{-12}$ ohms. Thus unquestionably a substantial reduction in the resistance of the silver was observed.

In a further experiment, a gold film was sandwiched between a lead film and a tin film. In this case, a persistent current could not be generated above 3.57° K., well below the transition temperature of both tin and lead; thereafter the critical current increased smoothly to more than 2 amperes at 3° K.

In addition to the combinations described above, further laminar superconductors were formed by superimposing thin films of tin and silver; lead and gold and tin and gold. Each of these combinations behaved as superconductors, the $T_c$ of the laminar superconductors being lower than the $T_c$'s of the natural superconductors (tin and lead) in the same manner as shown above for the lead-silver combinations.

A number of the more common superconducting metals have been listed above in connection with the discussion on superconductivity. Other metals which are known to be superconducting are cadmium, gallium, hafnium, mercury, lanthanum, osmium, rhenium, rhodium, ruthenium, technetium, thorium, titanium, thallium, uranium, zinc and zirconium. In addition, the following compounds are known to be superconducting: MoC, $MoGa_2$, MoN, $Nb_3Au$, NbC, NbN, $Nb_3Sn$, $V_3Ga$, $V_3Ge$, $V_3Si$ and $V_3Sn$.

Among the non-superconductor metals which may be superimposed on or laminated with the elemental and compound superconductors listed above are copper, gold, iridium, molybdenum, palladium, platinum, silver, strontium, tungsten and the like. Among the natural superconductors listed above are several which have such low $T_c$'s as to make them behave as normal resistive metals above say about 1° K. If it is desired to induce the superconducting state in a natural superconductor at temperatures above its natural $T_c$, then this natural superconductor may be used as the so-called non-superconductor component of the laminar superconductor to be constructed. For example, a film of rhodium ($T_c$=0.9° K.) may be superimposed on a film of tin ($T_c$=3.7° K.) to give a superconductor having a $T_c$ less than 3.7° K. but greater than 1° K. The choice of 1° K. is of course purely arbitrary for purposes of an example only. The possibility of using a second natural superconductor as the non-superconductor in a laminar superconductor implies that the non-superconductor component need only be a metal which normally exhibits the properties of a non-superconductor under the specified conditions.

It is also within the scope of this invention to superimpose one natural superconductor upon another natural superconductor to form a laminar superconductor, the superconducting properties of which are different from those of either superconductor used to form it.

The superconductors of this invention may be used to construct a number of different circuit elements or employed in any apparatus requiring superconducting materials. Two such circuit elements will be described below.

Figure 8:
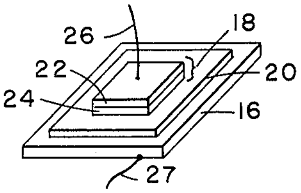
FIG. 8 illustrates a tunneling device constructed using the superconductors of this invention.

The tunneling device illustrated in FIG. 8 will show the application of the novel superconductors of this invention to one of the types of cryogenic electrical circuit elements. The tunneling device of FIG. 8 consists of two components 16 and 18 which are separated by a dielectric layer 20 of sufficient thickness and possessing electrical characteristics which permit a tunneling current to pass between the two elements 16 and 18 when a potential difference is applied across them. In the element illustrated in FIG. 8 no substrate is provided but one may, of course, be used. In a tunneling device of the character illustrated either one or both of the elements 16 and 18 must exhibit an electron energy gap, i.e., one must be a superconductor while the other may be a normal metal, a superconductor, or a semiconductor. In the case of the element of FIG. 7 it is assumed that component 18 is a superconductor and that it is a laminar superconductor constructed in accordance with this invention. Thus the superconductor 18 comprises layers 22 and 24, one of which is a non-superconductor metal, the other of which is a superconductor. The order is not important and of course component 18 may be constructed as the superconductors shown in FIGS. 2, 4 or 5. Suitable connecting wires 26 and 27 are provided and it will be appreciated that if component 16 is a semiconductor, this connecting lead will be attached by any suitable method associated with the use of semiconductors.

An element such as shown in FIG. 8 was constructed wherein component 16 was a tin film and component 18 was a lead-silver laminar superconductor, the lead being deposited on top of the silver film. A Formvar dielectric layer was placed between the two components 16 and 18 in the position of the dielectric layer 20 of FIG. 8. When an electric potential was impressed across the element (immersed in liquid helium) through connections 26 and 27 the presence of an electron energy gap in the sliver film 24 was noted as having a low temperature limiting value of 0.16 mv. Thus in the component comprising the combination of a lead film in direct contact with a silver film an electron energy gap was established in the silver as well as in the lead at temperatures below the transition temperature of the laminar superconductor 18. The gap was smaller in the silver side of the component than in pure lead and it is believed that the width of the gap will probably change according to its position in the silver with respect to the lead. That, is, the gap may vary in width through the cross section of the silver film being greatest at its point of contact with the lead film.

Figure 9:
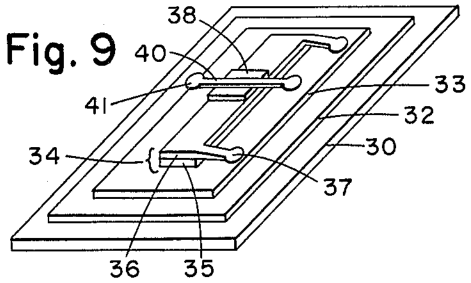
FIG. 9 illustrates a cryotron constructed using the superconductors of this invention.

FIG. 9 illustrates the application of the laminar superconductor component to the construction of a cryotron, another type of circuit element. In the cryotron of FIG. 9 there is provided a substrate 30 on which is deposited a layer 32 of a superconductor such as lead which serves as a ground plane for the cryotron. On the lead surface is then deposited a layer of insulation 33 (such as SiO) and on the insulation is then deposited a cryotron gate 34 which will be seen to be made up of two film layers 35 and 36. These two layers are a superconductor 36 and a non-superconductor 35, the latter being shown as the bottom layer. However, it could be the top layer. The cryotron gate 34 includes two connections 37 to which wires may be soldered. Across the cryotron gate 34 is then deposited another layer 38 of insulation and on top of this a cryotron control 40 which is also equipped with suitable connecting point 41. Typically, such a cryotron may consist of a glass substrate, a lead ground plane, a cryotron gate formed of lead and silver films and finally a cryotron control formed of lead. It will be seen that it is possible by using the laminar superconductor of this invention to construct a cryotron using only one natural supercodnuctor, namely lead. Since the $T_c$ of the cryotron gate 34 using the laminar superconductor involving lead and silver is lower than that of the natural superconductor, lead, it is possible to use a lead control 40 since it will have a higher transition temperature than the gate.

Figure 10:
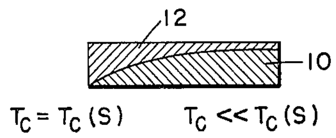
FIG. 10 is a cross-sectional view of another modification of a laminar superconductor of this invention.

Finally, in FIG. 10 there is illustrated another modification of a laminar superconductor constructed in accordance with this invention. The construction of FIG. 10 illustrates how a laminar superconductor may be made having a critical temperature which varies within the assembly. By varying the thicknesses of the superconductor and the non-superconductor components through the cross section of the laminar superconductor, the critical temperature of the assembly may be made to vary from that of the natural superconductor to a temperature which is much lower than that of the natural superconductor. A. $T_c$ gradient may be thus established in one or more directions within the laminar superconductor. Such a configuration offers interesting possibilites in the construction of bolometers and the like where it is desirable to be able to control and vary the width within an element of the superconducting portion with intensity of radiation, for example. A similar construction may be used as a resistance thermometer since the longitiudinal resistance of the laminar superconductor depends upon the length of the assembly which is superconducting. Thus a laminar superconductor such as illustrated in FIG. 10 may be incorporated in devices designed to detect electromagnetic radiation or temperature.

It will be seen from the above description of this invention that it provides new and unique superconductors, the properties of which may be adjusted and predetermined. There is also provided a method for establishing an electron energy gap in a normally conducting metal as well as controlling the width of the electron energy gap in normally superconducting metals.

We claim:

Method of forming a laminar superconductor which exhibits a critical temperature gradient in at least one direction comprising the steps of forming a thin layer of a natural superconductor varying in thickness in at least one direction and depositing on and in surface contact with said natural superconductor a thin layer of a non-superconductor metal such that the thickness of said non-superconductor film is substantially complementary to the thickness of said natural superconductor film, thereby forming a plural layer of substantially the same overall thickness.

References Cited by the Examiner

UNITED STATES PATENTS

| | | | |
|---|---|---|---|
| 2,731,366 | 1/1956 | Weinrich | 117—107 |
| 2,846,381 | 8/1958 | Frick et al. | 204—54 |
| 2,890,135 | 6/1959 | Jenkins | 117—107 |
| 3,031,400 | 4/1962 | Tsu | 204—54 |
| 3,041,566 | 6/1962 | Cloud | 338—32 |
| 3,049,686 | 8/1962 | Walters | 338—32 |
| 3,115,612 | 12/1963 | Meissner | 338—32 |

OTHER REFERENCES

Meissner II: "The Physical Review," vol. 117, No. 3, pp. 672–680, Feb. 1, 1960.

RICHARD D. NEVIUS, *Primary Examiner.*

RICHARD M. WOOD, *Examiner.*

H. T. POWELL, W. L. JARVIS, *Assistant Examiners.*